United States Patent [19]

Sato et al.

[11] Patent Number: 5,298,360
[45] Date of Patent: Mar. 29, 1994

[54] IMAGE FORMATION PROCESS AND TRANSFER MATERIAL

[75] Inventors: Morimasa Sato; Masayuki Iwasaki; Fumiaki Shinozaki, all of Shizuoka, Japan

[73] Assignee: Fuji Photo Film Co., Ltd., Kanagawa, Japan

[21] Appl. No.: 800,110

[22] Filed: Nov. 29, 1991

[30] Foreign Application Priority Data

Dec. 1, 1990 [JP]  Japan .................................. 2-400047

[51] Int. Cl.$^5$ ............................................. G03C 11/12
[52] U.S. Cl. .................................... 430/256; 430/257; 430/349; 430/330; 430/252
[58] Field of Search ............... 430/256, 257, 262, 349, 430/330, 263, 252

[56] References Cited

U.S. PATENT DOCUMENTS

| | | | |
|---|---|---|---|
| 3,671,236 | 6/1972 | van Beusekom | 430/143 |
| 4,268,601 | 5/1981 | Namiki et al. | 430/263 |
| 4,719,169 | 1/1988 | Platzer et al. | 430/257 |

Primary Examiner—Charles L. Bowers, Jr.
Assistant Examiner—Mark F. Huff
Attorney, Agent, or Firm—Sughrue, Mion, Zinn, Macpeak & Seas

[57] ABSTRACT

A layer transfer material which comprises a temporary support, a light-sensitive resin layer and a separation layer interposed between the temporary support and the light-sensitive resin layer, wherein the separation layer has a low oxygen permeability and a softening point of 80° C. or below and is easily separable from the temporary support and a method of its use.

6 Claims, No Drawings

IMAGE FORMATION PROCESS AND TRANSFER MATERIAL

FIELD OF THE INVENTION

This invention relates to a light-sensitive transfer material in which a separation layer is interposed between a light-sensitive resin layer and a support and which is best suited for dry type transfer to a base substrate having an irregular surface, as well as a process for the formation of images using the material. The transfer material and the image formation process of this invention are useful for the preparation of multiple color patterns such as color filters or display boards having multiple color images.

BACKGROUND OF THE INVENTION

A material for use in the transfer of a light-sensitive resin layer to a base substrate is disclosed, for example, in JP-B-56-40824 (corresponding to U.S. Pat. No. 3,884,693) (the term "JP-B" as used herein means an "examined Japanese patent publication"). This transfer material is applicable to the production of printed circuits, forme (printing plate) and the like. It comprises a support, a separation layer and a photopolymerization layer. For the purpose of image formation, the photopolymerization layer of the material is contacted with a base substrate, the support is peeled off and then exposure and development are conducted through the separation layer to form an image on the base substrate. In this instance, the separation layer acts as a barrier to prevent permeation of oxygen which permits exposure to be conducted efficiently in the air, without reducing resolution because of its extreme thinness of about 0.5 to 5 μm. However, in spite of this thinness of the separation layer, transfer of the prior art material becomes inappropriate when a base substrate to be transferred has an irregular surface and an extremely thin photopolymerization layer is transferred on the substrate, because bubbles and the like are trapped in the space between the photopolymerization layer and the base substrate.

A transfer material in which an intermediate layer such as a polyvinyl alcohol derivative is interposed between a support and a light-sensitive resin layer is disclosed in JP-A-2-213849 (corresponding to EP-A-373438) (the term "JP-A" and "EP-A" as used herein mean an "unexamined published Japanese patent application" and an "unexamined published European patent application," respectively). This transfer material was developed with the object of improving the separability from a temporary support and dissolution characteristics. This published application does not disclose transferability of the material to a base substrate where the surface has an irregularity. From a practical standpoint, this transfer material exhibits incomplete transferability and therefore tends to entrap bubbles when the surface of a base substrate has an irregularity.

SUMMARY OF THE INVENTION

In view of the above, it therefore is an object of the present invention to provide a process for the formation of a light-sensitive resin layer on a support, especially a support whose surface has an irregularity, by transfer means, in which a transfer material is constructed in such a manner that the light-sensitive resin layer of the transfer material can be transferred from its temporary support to a final support without transfer difficulties arising due to the trapping of bubbles and the like, the light-sensitive layer can be separated from the temporary support in good condition and exposure can be performed in the air. This invention also provides a transfer material which can be used in this process.

In particular, the present invention provides a process for the formation of images using a layer transfer material in which a light-sensitive resin layer is coated on a temporary support, the process comprising the steps of contacting the surface of the light-sensitive resin layer with the surface of a final support at least with heating, separating the temporary support and subjecting the light-sensitive resin layer to pattern exposure and development to form an image on the final support, wherein a separation layer is interposed between the light-sensitive resin layer and the temporary support of the layer transfer material with this separation layer having a stronger adhesion to the light-sensitive resin layer than to the temporary support, a low oxygen permeability and a softening point of about 80° C. or below. Preferably, the separation layer has a thickness of from 6 to 30 μm and is soluble in water. Also preferably, the final support is transparent, the light-sensitive resin layer is colored and the pattern exposure is effected using a masking original having a matrix pattern or a stripe pattern.

In addition, the present invention provides a layer transfer material in which a light-sensitive resin layer is coated on a temporary support, which further includes a separation layer with a stronger adhesion to the light-sensitive resin layer than to the temporary support, a low oxygen permeability and a softening point of about 80° C. or below, where the separation layer is interposed between the light-sensitive resin layer and the temporary support.

Other objects and advantages of the present invention will become apparent from the description set forth below.

DETAILED DESCRIPTION OF THE INVENTION

The above-described objects of the present invention are accomplished by the development of a process for the formation of images using a transfer material in which a light-sensitive resin layer is coated on a temporary support. This process comprises the steps of contacting the surface of the light-sensitive resin layer with the surface of a final support with heating and, if necessary, under a pressure, separating the temporary support and subjecting the light-sensitive resin layer to pattern exposure and development to form an image on the final support. A separation layer is interposed between the light-sensitive resin layer and the temporary support of the transfer material and this separation layer has a stronger adhesion to the light-sensitive resin layer than to the temporary support, a low oxygen permeability (Oxygen Permiation Coefficient is preferably from $0.001 \times 10^{10}$ to $50 \times 10^{10}$ cm$^2$/sec relative humidity being 30%) and a softening point of about 80° C. or below.

The support used in the transfer material of the present invention should be chemically and thermally stable and be flexibile. Illustrative examples include thin sheets of polyethylene terephthalate, polycarbonate and the like and these are used most preferably.

An organic polymer material having a softening point of about 100° C. or below may be used preferably as a material for use in the separation layer. More preferably, this material may be selected from organic polymer materials having a softening point of about 80° C. or lower determined by the Vicat test, more precisely, in accordance with the standard method for the measurement of softening point of polymers, ASTM D 1235, established by American Society for Testing Materials. An advantage of using such a low softening point organic polymer material is that, when a transfer material is transferred to a base substrate whose surface has an irregularity with heating and, if necessary, under a pressure, the transfer layer is adhered effectively to the base substrate and conforms to the irregularity on the surface of the substrate. Thus, the transfer step can be completed without any trace of bubbles remaining. On the contrary, if a polymer material having a high softening point is used, a high temperature is required for the transfer step which is disadvantageous from a handling point of view. Consequently, the organic polymer material used in the separation layer has a softening point of about 80° C. or lower as determined by the Vicat test, preferably 60° C. or lower, more preferably 50° C. or lower.

At least one compound selected from the group consisting of the following illustrative examples may be used organic polymer materials having a softening point of about 80° C. or lower: polyolefins such as polyethylene, polypropylene and the like; ethylene copolymers such as a copolymer of ethylene and vinyl acetate or saponified products thereof, a copolymer of ethylene and an acrylic ester or saponified products thereof and the like; polyvinyl chloride, vinyl chloride copolymers such as a copolymer of vinyl chloride and vinyl acetate or saponified products thereof, polyvinylidene chloride, a vinylidene chloride copolymer and the like; polystyrene, styrene copolymers such as a copolymer of styrene and (meth)acrylate or saponified products thereof and the like; polyvinyltoluene, vinyltoluene copolymers such as a copolymer of vinyltoluene and (meth)acrylate or saponified products thereof and the like; poly(meth)acrylate, (meth)acrylate copolymers such as a copolymer of butyl(meth)acrylate and vinyl acetate and the like; polyamide resins such as vinyl acetate copolymer nylon, copolymerized nylon, N-alkoxymethyl nylon, N-dimethylamino nylon and the like; and synthetic rubber and chlorinated rubber, of which copolymerized nylon and N-dimethylamino nylon are preferable. Other useful organic polymer materials having a softening point of about 80° C. or lower are disclosed, for example, in *Purasuchikku Seino Binran (Handbook of Plastics Properties*, edited by Japan Plastics Molding Industries Association, Japan Federation of Plastics Industries; published by Kogyo-Chosa-Kai; October 25, 1968).

The softening points of these organic polymer materials may substantially be lowered by adding a plasticizer which is compatibile with these polymers. Even in the case of an organic polymer material having a softening point of 80° C. or more, it is possible to further lower the softening point substantially to a level of 80° C. or below by the addition of a compatible plasticizer. The plasticizer or the addition amount thereof which can be used in the present invention can be selected so that the softening point of the material for the separation layer is within the range of from about −10° C. to about 80° C. (see *Purasuchikku Kako Binran, (Handbook of Plastic Manufacturing*, edited by Purasuchikku Kako Gijutsu Binran-Henshu Iinkai; published by Nikkan Kogyo Shimbunsha, 1969).

Preferably, these organic polymer materials have similar dissolution characteristics to those of the light-sensitive resin layer, or have a solubility in a solvent in which the light-sensitive resin layer is not soluble at all.

If the material for the separation layer has a dissolution characteristic similar to those for the light-sensitive resin layer, the resulting separation layer is preferable being removed easily. For example, the separation layer which is soluble in the solution for removement of the light-sensitive resin in the unexposed portion, i.e., development, can be removed during the development step.

On the other hand, the material for the separation layer which is soluble in a solvent not dissolving those of the light-sensitive resin (water, n-hexane, etc.) is preferable because removement of the separation layer does not give an adverse influence upon the development properties of the light-sensitive resin layer.

In order to control the adhesion strength of the separation layer to its temporary support, these organic polymer materials may be further mixed with various types of other polymers, subcooling agents, adhesion improvers, surfactants (e.g., fluorine-type surfactant), lubricants (e.g., silicon-containing compound and a polyfluorinated hydrocarbon) and the like, provided that the softening point substantially ranges from about −10° C. to about 80° C. when these additives are used.

The separation layer preferably has a thickness of from 6 to 30 μm, more preferably from 9 to 20 μm. Thicknesses smaller than 6 μm render impossible complete covering of irregularities having a depth of 1 μm or more on the surface of a base substrate and if larger than 30 μm, this results in a reduction in resolution.

The light-sensitive resin layer should have such a thermal property that it becomes soft or adherent at a temperature of about 150° C. or lower. Although most prior art photopolymerization layers have such a thermal property, these prior art layers can be modified further by simply adding a thermoplastic bonding agent or a compatible plasticizer thereto.

According to the transfer material of the present invention, any of the prior art light-sensitive resins disclosed, for example, in Japanese Patent Application No. 2-82262 (corresponding to the U.S. patent application serial number 7/675,825, filed on March 27, 1991, now U.S. Pat. No. 5,155,005), can be used. Illustrative examples of such materials include a light-sensitive resin which comprises a negative type diazo resin and a binder, a photo-polymerizable composition, a light-sensitive resin composition which comprises an azide compound and a binder, a cinnamic acid type light-sensitive resin composition and the like. Most preferred of these materials is a photopolymerizable resin which comprises a photopolymerization initiator, a photo-polymerizable monomer and a binder as basic elements.

When coloring of the light-sensitive resin layer is desired, conventional processes disclosed, for example, in Japanese Patent Application No. 2-82262 are useful.

The thickness of the light-sensitive resin layer of the present invention is preferably in the range of from 1 to 5 μm, more preferably, from 1.5 to 3 μm.

Preferably, the surface of the light-sensitive resin layer opposite the support (temporary support) side is coated with a thin covering film in order to prevent incidental impurities from adhering to the resin layer and to prevent damage during storage. Such a covering sheet may comprise a material which is the same as or similar to that of the support, but should be easily separable from the light-sensitive resin layer. Silicone paper, polyolefin sheet or polytetrafluoroethylene sheet may be used advantageously as a material for the covering sheet. Preferably, the covering sheet has a thickness of from about 5 to 100 μm, more preferably from 7 to 30 μm.

The transfer material of the present invention may be prepared by coating and drying a solution of materials for the separation layer on a support and then further coating and drying on the resulting separation layer the component of a light sensitive resin layer dissolved in a solvent which does not dissolve the separation layer, or by coating the light-sensitive layer on a covering sheet and then laminating this with the separation layer sheet. The solvent or the addition amount thereof which can be used in the present invention can be suitably selected according, for example, to *Polymer Handbook*, (J. Brandrup, E.H. Immergut John Wiley & Sons, 1966).

The transfer material of the present invention can be used in the following manner. Firstly, the covering sheet is removed from the transfer material and the light-sensitive resin layer side is contacted with the final support with heating (up to about 130° C. in general, preferably from 40° to 100° C.) and, if necessary, under a pressure (preferably from 0.1 to 10 kg/cm$^2$, more preferably from 0.5 to 5 kg/cm$^2$). This step may be effected conventionally, for example, in accordance with a process disclosed in Japanese Patent Application No. 2-82262. Thereafter, the temporary support of the transfer material is removed by peeling it off and the resulting material is exposed through a specific mask and then to image development. The amount of exposure necessary in the present invention is varied depending on the light-sensitive resin layer to be used but can be easily selected after experiment in the art. A transparent material such as glass may be used as the final support.

Development may be carried out by conventional means, for example, by treating the material with a solvent or a developing solution, especially with an alkali solution. An illustrative example of such a development step is disclosed in Japanese Patent Application No. 2-82262. If desired, a multiple color image can be formed by preparing a series of transfer materials, each having different colored light-sensitive layer and by subjecting the light-sensitive resin layers with different hues repeatedly to transfer, exposure and development.

It is preferable that the separation layer is removed during the development step in view of simplifying the process, without an adverse influence of the transfer material upon the flatness of final image. When the final support has an excellent flatness, the first color transfer material may not always require a separation layer since the bubble remaining is absent.

By the use of the transfer material of the present invention, multiple color images, especially color filters having excellent properties, can be prepared.

The following examples are given to further illustrate the present invention, but the present invention is not to be construed as limited to these examples. Unless otherwise indicated herein, all parts, percents, ratios and the like are by weight.

EXAMPLE 1

1) Preparation of Coating Solution for Separation Layer:

A solution of the Formula 1 below was prepared as a coating solution for a separation layer.

| Formula 1 | |
|---|---|
| Water Soluble Nylon (A-90, Toray Industries, Ltd) | 100 g |
| Methanol | 320 g |
| Methyl Cellosolve | 80 g |

2) Preparation of coating solution for sensitive resin layer:

Four light-sensitive color solutions, black (BL, for shading layer use), red (for R layer use), green (for G layer use) and blue (for B layer use), were prepared with the compositions shown in Table 1 below, and used as coating solutions for the formation of colored light-sensitive resin layers.

TABLE 1

Compositions of Coating Solutions for Colored Light-Sensitive Resin Layer

| | Red (g) | Blue (g) | Green (g) | Black (g) |
|---|---|---|---|---|
| Benzyl Methacrylate/Methacrylic Acid Copolymer (molar ratio, 73/27; viscosity, 0.12) | 60 | 60 | 60 | 60 |
| Pentaerythritol Tetraacrylate | 43.2 | 43.2 | 43.2 | 43.2 |
| Michler's Ketone | 2.4 | 2.4 | 2.4 | 2.4 |
| 2-(o-Chlorophenyl)-4,5-Diphenyl Imidazole Dimer | 2.5 | 2.5 | 2.5 | 2.5 |
| Irgazin Red BPT (red) | 5.4 | — | — | — |
| Sudan Blue (blue) | — | 5.2 | — | — |
| Copper Phthalocyanine (green) | — | — | 5.6 | — |
| Carbon Black (black) | — | — | — | 5.6 |
| Methyl Cellosolve Acetate | 560 | 560 | 560 | 560 |
| Methyl Ethyl Ketone | 280 | 280 | 280 | 280 |

3) Preparation of Transfer Material:

A predetermined amount of the above-described coating solution for separation layer use (Formula 1) was coated on a polyethylene terephthalate (PET) film having a thickness of 100 μm and the coated solution was dried to prepare a separation layer with the constitution shown in Table 2 below. On the resulting separation layer laminated on the PET film was further coated a coating solution for BL, R, G or B layer use to form a light-sensitive resin layer with a thickness of 2 μm. Thereafter, a protective polypropylene sheet of a thickness of 13 μm was applied by compression to the surface of the thus-formed light-sensitive resin layer. In this manner, a set of four colored transfer materials was prepared.

TABLE 2

Constitution of Separation Layers

| Example No. | Separation Layer Formula | Softening Point (°C.) | Film Thickness (μm) |
|---|---|---|---|
| Example 1 | 1 | −25 | 10 |
| Example 2 | 2 | 54 | 15 |
| Example 3 | 3 | 65 | 20 |
| Example 4 | 1 | −25 | 6 |
| Com. Ex. 1 | 4 | <80 | 10 |
| Com. Ex. 2 | 1 | −25 | 2 |
| Com. Ex. 3 | 2 | 54 | 5 |
| Com. Ex. 4 | 3 | 65 | 4 |

4) Evaluation of Transfer Materials:

After removing the protective film, a sample of the transfer material having red light-sensitive layer was superposed on a glass plate in such a way that the thus uncovered light-sensitive layer contacted the glass plate. This assembly was subsequently subjected to lamination using a laminator (Fast Laminator 8B-550-

80, manufactured by Taisei Corp.) at a pressure of 2 kg/m², at a roller temperature of 105° C. and at a lamination rate of 0.9 m/min. Thereafter, the red light-sensitive resin layer was transferred to the glass plate by peeling off the temporary support of the red light-sensitive resin sheet.

Next, exposure (50 mJ/cm²) was made from the red light-sensitive resin layer side of the resulting material through a mask, and the thus exposed red light-sensitive resin layer was subjected to development at a temperature of 35° C. for 20 seconds using a developing solution of the following composition.

| Sodium Carbonate | 15 g |
| Butyl Cellosolve | 1 g |
| Water | 1 kg |

Subsequent washing and drying resulted in the formation of a red image (made up of dots, 2 μm in thickness) on the glass plate.

To the red image side of the glass plate was further transferred the green transfer material in the same manner (the exposure amount of 100 mJ/cm²), and its transferability was evaluated by observing the generation of remaining bubbles due to a 2 μm irregularity arising during the transfer step.

The thus double-transferred material was exposed to light through a mask and developed in the same manner as described above to obtain red and green color images. The adhesion ability was evaluated by observing deletion, defection and the like of the green image.

The same procedure was repeated using the blue transfer material to evaluate the presence of bubbles remaining during the transfer step (the exposure amount of 50 mJ/cm²).

In the same manner, the black transfer material was checked for the presence of bubbles remaining during the transfer step (the exposure amount of 400 mJ/cm²).

Thus, through the formation of multiple R, G, B and BL color images on a glass plate as described above, the image qualities of each color such and deletion and defection of their shapes, pin hole formation and the like were evaluated.

All of the above showed excellent adhesion abilities and image qualities with no trace of bubbles remaining.

EXAMPLE 2

Samples of transfer materials were prepared and their properties were evaluated in the same manner as in Example 1 except that a solution of the Formula 2 below was used as a coating solution for the separation layer and the separation layer was formed in accordance with the constitution shown in Table 2 above.

| Formula 2 | |
| --- | --- |
| Polyvinyl Alcohol (PVA 205, Kurary Co., Ltd.) | 100 g |
| Polyethylene Glycol (PEO #2000, Wako Pure Chemical Industries, Ltd.) | 40 g |
| Water | 400 g |
| Methanol | 400 g |

All of these samples showed excellent adhesion abilities and image qualities with no trace of bubbles remaining.

EXAMPLE 3

Samples of transfer materials were prepared and their properties were evaluated in the same manner as in Example 1 except that a solution of the Formula 3 below was used as a coating solution for the separation layer and the separation layer was formed in accordance with the constitutions shown in Table 2 above.

| Formula 3 | |
| --- | --- |
| PVA 205 | 100 g |
| Monoacetin | 40 g |
| PEO #2000 | 2 g |
| Water | 400 g |
| Methanol | 400 g |

All of these samples showed excellent adhesion abilities and image qualities with no trace of bubbles remaining.

EXAMPLE 4

Samples of transfer materials were prepared using the above described solution of Formula 1 as a coating solution for the separation layer and their properties were evaluated in the same manner as in Example 1 except that the separation layer was formed in accordance with the constitution shown in Table 2 above.

All of these samples showed excellent adhesion abilities and image qualities with no trace of bubbles remaining.

COMPARATIVE EXAMPLE 1

Samples of transfer materials were prepared and their properties were evaluated in the same manner as in Example 1 except that a solution of the Formula 4 below was used as a coating solution for the separation layer and the separation layer was formed in accordance with the constitution shown in Table 2 above.

| Formula 4 | |
| --- | --- |
| PVA 205 | 100 g |
| Methanol | 200 g |
| Water | 200 g |

In all samples tested, peeling of the picture element was found at the time of exposure and development and bubbles remaining were observed.

COMPARATIVE EXAMPLE 2

Samples of transfer materials were prepared using the solution of Formula 1 above as a coating solution for the separation layer and their properties were evaluated in the same manner as in Example 1 except that the separation layer was formed in accordance with the constitution shown in Table 2 above.

In all samples tested, peeling of the picture element was found at the time of exposure and development and bubbles remaining were observed.

COMPARATIVE EXAMPLE 3

Samples of transfer materials were prepared and their properties were evaluated in the same manner as in Example 1 except that the solution of Formula 2 above was used as a coating solution for the separation layer and the separation layer was formed in accordance with the constitution shown in Table 2 above.

In all samples tested, peeling of the picture element was found at the time of exposure and development and bubbles remaining were observed.

COMPARATIVE EXAMPLE 4

Samples of transfer materials were prepared and their properties were evaluated in the same manner as in Example 1 except that the solution of Formula 3 above was used as a coating solution for the separation layer and the separation layer was formed in accordance with the constitution shown in Table 2 above.

In all samples tested, peeling of the picture element was found at the time of exposure and development and bubbles remaining were observed.

Thus, it is apparent that the present invention provides a process for the formation of a light-sensitive resin layer on a support, especially a support whose surface has an irregularity, by means of transfer of a novel transfer material. Because of the unique construction of the transfer material, the light-sensitive resin layer of the transfer material can be transferred from its temporary support to a final support without transfer difficulties arising due to the trapping of bubbles and the like, and the light-sensitive layer can be separated from the temporary support in good condition and exposure can be performed in the air.

While the present invention has been described in conjunction with specific embodiments thereof, it is evident that many alternatives, modifications and variations will be apparent to those skilled in the art in light of the foregoing description. Accordingly, it is intended to include all such alternatives, modifications and variations as set forth within the spirit and scope of the appended claims.

What is claimed is:

1. A process for forming images using a layer transfer material comprising a light-sensitive resin layer coated on a temporary support, said process comprising the steps of contacting the surface of said light-sensitive resin layer with the surface of a final support at least with heating, removing the temporary support by separation and subsequently subjecting said light-sensitive resin layer to pattern exposure and development to form an image on the final support, wherein a separation layer is interposed between said light-sensitive resin layer and said temporary support of said layer transfer material with the separation layer having a stronger adhesion to said light-sensitive resin layer than to said temporary support, a low oxygen permeability and a softening point of about 80° C. or below.

2. The image forming process according to claim 1, wherein said separation layer has a thickness of from 6 to 30 μm.

3. The image forming process according to claim 1, wherein said separation layer is soluble in water.

4. The image forming process according to claim 1, wherein said final support is transparent, said light-sensitive resin layer is colored and said pattern exposure is effected using a masking original having a matrix pattern or a stripe pattern.

5. A layer transfer material comprising a temporary support having thereon a light-sensitive resin layer and further comprising a separation layer interposed between said light-sensitive resin layer and said temporary support, said separation layer having a stronger adhesion to said light-sensitive resin layer than to said temporary support, a low oxygen permeability and a softening point of about 80° C. or below.

6. The material according to claim 5, wherein the separation layer is soluble in water.

* * * * *